United States Patent [19]

Murakami et al.

[11] Patent Number: 4,520,328

[45] Date of Patent: May 28, 1985

[54] AMPLITUDE MODULATION CIRCUIT HAVING STABLE MODULATION CHARACTERISTICS

[75] Inventors: Yoshihirō Murakami, Daito; Nobukazu Hosoya, Ikoma, both of Japan

[73] Assignee: Sanyo Electric Co. Ltd., Osaka, Japan

[21] Appl. No.: 479,069

[22] PCT Filed: Jul. 20, 1982

[86] PCT No.: PCT/JP82/00280

§ 371 Date: Mar. 21, 1983

§ 102(e) Date: Mar. 21, 1983

[87] PCT Pub. No.: WO83/00411

PCT Pub. Date: Feb. 3, 1983

[30] Foreign Application Priority Data

Jul. 20, 1981 [JP] Japan .................. 56-113848

[51] Int. Cl.³ .............................................. H03C 1/02
[52] U.S. Cl. .............................. 332/31 T; 331/116 R; 331/117 R; 331/109; 332/38; 332/59
[58] Field of Search ............... 331/117 R, 109, 182, 331/116 R; 332/31 T, 38, 59, 63

[56] References Cited

U.S. PATENT DOCUMENTS 3,649,929 3/1972 Thompson ................. 331/109 X
3,870,971 3/1975 Takahashi et al. ......... 331/108 D
3,963,996 6/1976 Skerlos ...................... 331/117 R
4,419,634 12/1983 Druegh et al. ............. 331/117 R

FOREIGN PATENT DOCUMENTS 54-79547 6/1979 Japan .
56-120203 9/1981 Japan .

Primary Examiner—Siegfried H. Grimm
Attorney, Agent, or Firm—Armstrong, Nikaido, Marmelstein & Kubovcik

[57] ABSTRACT

An amplitude modulation circuit wherein a resonant circuit for the determination of the carrier-wave frequency is connected to the collector of one transistor forming a differential pair of transistors forming a differential amplifier having its ground terminal connected to a constant current source while an output terminal of the resonant circuit is coupled to the base of the other transistor forming the differential pair so as to apply a positive feedback to the other transistor thereby forming a carrier wave oscillating circuit, and a constant current adjusting means for dividing by switching the current to be supplied to one of the transistors of the differential pair is connected between the differential amplifier and the constant current source, such that, by supplying a modulating signal to the constant current adjusting means to vary the oscillating level of the carrier wave, a modulated signal at a constant modulation degree can be obtained from the base of the other of the transistors forming the differential pair.

5 Claims, 8 Drawing Figures (a) fo (b) Fo (c) Fo

A B (a)

(b)

(c)

(d)

AMPLITUDE MODULATION CIRCUIT HAVING STABLE MODULATION CHARACTERISTICS

FIELD OF TECHNOLOGY

This invention relates to an amplitude modulation circuit (hereinafter referred to as an "AM circuit") and in particular to an AM circuit providing a constant degree of modulation.

Such an AM circuit providing a constant degree of modulation is built into a radio frequency (hereinafter referred to as "RF") modulator such as is used when a multiplexed sound signal being reproduced as by use of a video tape recorder (hereinafter referred to as "VTR") is supplied to an antenna terminal of a television receiver, for high frequency modulation of the VTR output, and is used to provide a modulation signal to be modulated (amplitude-modulated signal) using as a modulating signal a pilot signal of predetermined frequency necessary to discriminate the type of the multiplex sound signal.

DESCRIPTION OF THE PRIOR ART

A prior art AM circuit including its peripheral circuitry is shown in FIG. 1. The illustrated circuit consists of a modulating signal oscillator circuit 1, a carrier wave oscillator circuit 2 and a modulation circuit 3.

The modulating signal oscillator circuit 1 is comprised of resistors $R_1'$ through $R_6'$ and $R_{11}'$, transistors $T_1'$ and $T_2'$, capacitors $C_1'$ through $C_3'$ and $C_8'$ and a reed-filter 4, with its oscillator loop circuit being formed of the base of transistor $T_2'$, the collector of transistor $T_2'$, reed-filter 4, the base of transistor $T_1'$, the emitter of transistor $T_1'$, resistor $R_3'$, and with the loop being completed with the base of transistor $T_2'$. Modulating signal oscillator circuit 1 commences oscillation when the gain of this loop is 1 or more. The oscillator frequency is determined by the frequency selectivity of reed-filter 4 (for example, 922.5 Hz), and the wave form of the modulated signal is a sine wave $f_0$ as shown in FIG. 2a.

The carrier wave oscillator circuit 2 is comprised of transistor $T_3'$, resistors $R_7'$ and $R_8'$, capacitors $C_4'$ through $C_6'$ and an inductance coil $L_1'$. The oscillator loop of the carrier wave oscillator circuit 2 is formed by the emitter of transistor $T_3'$, capacitor $C_6'$, and the collector of transistor $T_3'$, with the loop being closed by the emitter of transistor $T_3'$. Carrier wave oscillator circuit 2 commences oscillation when the gain of this loop is 1 or more. The oscillator frequency $F_0$ is determined by the time constant of a resonant circuit 5 consisting of capacitor $C_6'$ and inductance coil $L_1'$, and is expressed in Equation 1:

$$F_0 = \frac{1}{2\pi \sqrt{L_1' C_6'}} \text{ Hz} \qquad (1)$$

The output wave form of carrier wave oscillator circuit 2 is shown in FIG. 2b, and appears as such because transistor $T_3'$ is caused to undergo a switching operation in accordance with the charging and discharging of capacitor $C_5'$ through resistor $R_8'$. However, in such a prior art circuit, it often occurs that high harmonic and side-band frequencies will tend to adversely affect the performance of the circuit shown in FIG. 1 (and other circuits not shown, i.e., a sound processing circuit) through a common grounded line and a power supply line.

Modulation circuit 3 is comprised of resistors $R_9'$ and $R_{10}'$, transistor $T_4'$, inductance coil $L_2'$ and capacitor $C_7'$. The carrier wave supplied from carrier wave oscillator circuit 2 to transistor $T_4'$ through resistor $R_9'$ is shaped by resonant circuit 6 composed of $L_2'$ and $C_7'$, which acts as a filter circuit to suppress the high harmonic and side-band frequencies generated in carrier wave oscillator circuit 2. The emitter potential of transistor $T_4'$ is varied by a modulating signal supplied to the emitter of transistor $T_4'$ from modulating signal oscillator circuit 1 through capacitor $C_2'$, and the current flowing through transistor $T_4'$ is thus modulated in accordance with this modulating signal. The gain of modulating circuit 3 is determined by the product of the impedance of resonance circuit 6, formed by inductance coil $L_2'$ and capacitor $C_7'$, and the current flowing though transistor $T_4'$. Therefore, when the current flowing through transistor $T_4'$ varies in response to the modulating signal, the amplitude of the carrier wave varies and the wave form of the output at output terminal 7 is amplitude-modulated as shown in FIG. 2c. The degree of amplitude-modulation, m, is expressed by the following equation using peak-to-peak values A and B as shown in FIG. 2c:

$$m = \frac{A - B}{A + B} \times 100 \, (\%) \qquad (2)$$

However, in a modulation circuit such as modulation circuit 3 as described, the degree of amplitude-modulation tends to change with the amplitude level of the modulating signal. In other words, variation in the oscillating level of modulating signal oscillator circuit 1 results in a variation in the degree of amplitude-modulation provided by modulation circuit 3. Thus, this prior art AM circuit cannot suitably provide a fixed degree of modulation. Although the use of a high precision modulating signal oscillator circuit 1 can be contemplated, not only is it difficult to eliminate any variation of the oscillating level for any given condition, but also it results in increased cost.

In addition, modulation circuit 3 must be provided with resonant circuit 6 consisting of coil $L_2'$ and capacitor $C_7'$, and therefore, the circuit shown in FIG. 1 is not suitable for incorporation into an integrated circuit (hereinafter referred to as an "IC") in view of resonant circuit 5 in carrier wave signal oscillator circuit 2. Although it can be contemplated to connect a circuit including the inductance coil and the reed filter exteriorly to the IC while the remaining circuits are fabricated onto the IC, this method tends to result in an increased number of terminal pins being required for the IC.

Accordingly, this invention has been developed in order to substantially eliminate the problems inherent in prior AM circuits, and has for its essential object the provision of an AM circuit in which the degree of modulation can be stably maintained at a constant value even though the modulating signal applied thereto changes.

Another object of the present invention is to provide an AM circuit having a constant degree of modulation and which is suitable for fabrication onto an IC.

SUMMARY OF THE INVENTION

The AM circuit of the present invention is constructed in combination with a carrier wave oscillator circuit.

The carrier wave oscillator circuit consists of a differential amplifier having its ground terminal connected with a constant current source, and a resonant circuit determining the carrier wave frequency is connected to the collector of one transistor forming a differential pair of transistors comprising the differential amplifier, while an output terminal of the resonant circuit is coupled to the base of the other transistor forming the differential pair, through a level-shift circuit so as to apply positive feedback to the other transistor to cause the other transistor to oscillate and thus produce the carrier wave. A constant current adjusting means for varying the current to be supplied to the differential amplifier, in accordance with a modulating signal, is connected between the differential amplifier and the constant current source. Since the constant current flowing through either one of the transistors forming the differential pair is adjusted by this constant current adjusting means, the oscillation level of the carrier wave will vary accordingly. That is, amplitude modulation at a constant degree of modulation can be achieved. In accordance with the present invention, not only can the modulating circuit and the carrier wave oscillator circuit be integrated together, but also the use of such a LC resonant circuit for shaping the wave form as hitherto required can be obviated. Further in accordance with the present invention, because amplitude modulation is effected by varying the constant current supplied to the differential amplifier, a stabilized operating characteristic can be obtained. Preferably, the constant current adjusting means consists of a plurality of transistors. That is, the constant current adjusting means comprises a plurality of transistors having their collectors connected together and their emitters connected together, with their collectors in turn being connected to the differential pair of transistors forming the differential amplifier, and at least one transistor having its emitter connected to the commonly connected emitters of the plurality of transistors and its collector connected to a power line, and is so designed that the constant current can be adjusted by applying the modulating signal to the base of one of the plurality of transistors connected to the differential pair of transistors forming the differential amplifier. By this construction, the constant current can be switched by the switching action of the differential transistor pair, and therefore any possible variation in modulation degree as a result of a change in the amplitude level of the modulating signal can be eliminated.

Preferably, circuits other than a circuit including an inductance coil, such as a resonant circuit, are fabricated onto an IC. In this way, not only can operational characteristics be stabilized, but also, a compact structure can be obtained as compared with an AM circuit formed by connecting discrete components.

Where the AM circuit of this invention is fabricated onto an IC, the constant current adjusting means can be constructed easily. That is, the number of the plurality of transistors connected to the differential pair of transistors forming the differential amplifier may be two at minimum, and the number of transistors connected to the power line may be one at minimum, while the surface area of the emitters of these two transistors connected to the differential pair of transistors and the single transistor connected to the power line may be formed by selecting these according to a predetermined ratio required to achieve a constant degree of modulation as determined beforehand. The emitter surface area of the transistors is determined by the IC fabrication process.

By constructing the AM circuit as hereinabove described, the modulation degree can stably be maintained at a constant value even in the presence of changes in the modulating signal and also, an AM circuit which may be easily fabricated onto an IC can be provided.

BEST MODE FOR CARRYING OUT THE INVENTION

Figure 3:
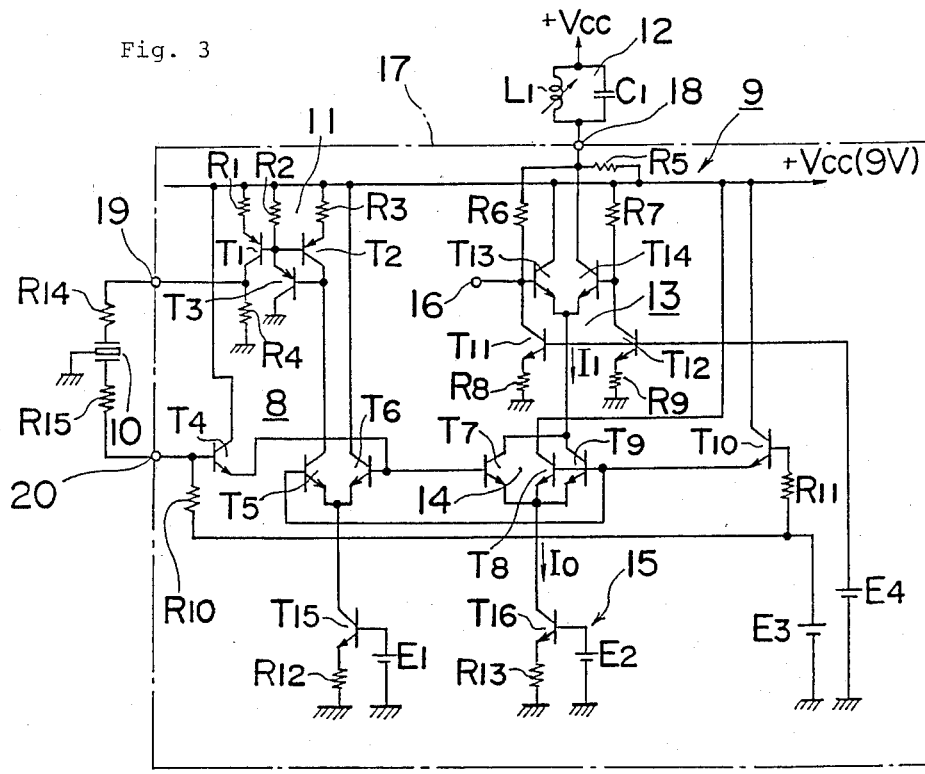
FIG. 3 is a circuit diagram showing an AM circuit according to the present invention.

An embodiment of this invention is shown in FIG. 3. The circuit shown includes a modulating signal oscillator circuit 8, and a carrier wave oscillator circuit 9 which concurrently serves as a modulation circuit.

Figure 1:
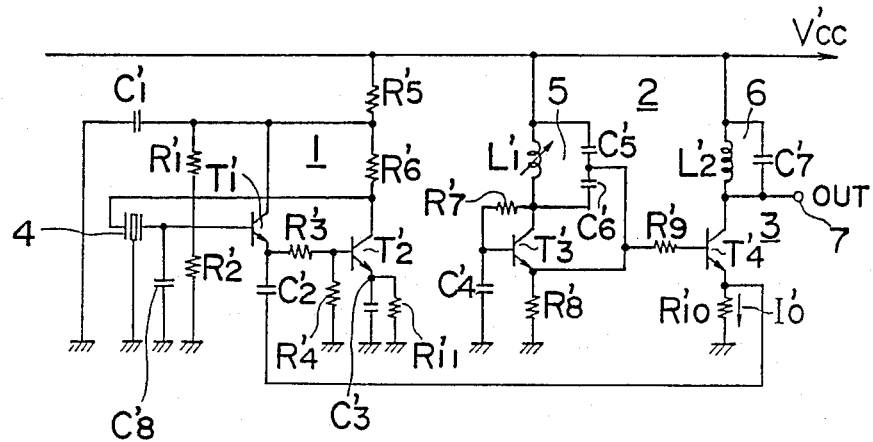
FIG. 1 is a circuit diagram showing a prior art AM circuit including its peripheral circuits.
Figure 2:
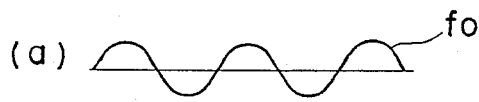
FIG. 2 shows various wave forms produced in portions of the circuit shown in FIG. 1.
Figure 2:
Figure 2:
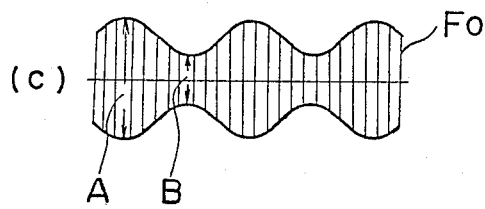

Modulating wave oscillator circuit 8 comprises transistors $T_1$ trough $T_6$ and $T_{15}$, resistors $R_1$ through $R_4$, $R_{10}$, $R_{12}$, $R_{14}$ and $R_{15}$, and a reed filter 10. The oscillation loop of modulating wave oscillator circuit 8 is formed of the base of transistor $T_6$, the emitter of transistor $T_6$, the emitter of transistor $T_5$, the collector of transistor $T_5$, the collector of transistor $T_1$, a current mirror circuit 11 formed by transistors $T_1$, $T_2$ and $T_3$ and resistors $R_1$ through $R_4$, resistor $R_{14}$, reed filter 10, resistor $R_{15}$, the base of transistor $T_4$, the emitter of transistor $T_4$, with the base of transistor $T_6$ closing the loop. When the gain of this circuit is 1 or more, oscillation occurs, with the oscillator frequency being determined by the frequency selectivity of the reed filter 10. Reed filter 10 is identical to reed filter 4 shown in FIG. 1 and has a high Q and is resonant at a frequency of 922.5 Hz±0.1 Hz.

Carrier wave oscillator circuit 9, which concurrently serves as a modulating circuit, consists of transistors $T_7$ through $T_{14}$ and $T_{16}$, a variable inductance coil $L_1$, capacitor $C_1$ and resistors $R_5$ through $R_9$ and $R_{13}$.

The details of connection are as follows:

Carrier wave oscillator circuit 9 includes a differential amplifier 13, with two NPN-type transistors $T_{13}$ and $T_{14}$ forming a differential pair of transistors forming differential amplifier 13 having their emitters connected together, and further includes a constant current source 15 connected to the commonly connected emitters of this differential pair, that is, connected to a grounded terminal thereof. Constant current source 15 consists of transistor $T_{16}$ having its base connected with a constant voltage source $E_2$ and its emitter grounded through resistor $R_{13}$.

Transistor $T_{14}$, forming a part of the differential pair of transistors forming differential amplifier 13, has its collector connected to one terminal of a resonant circuit 12 consisting of parallel connected variable inductance coil $L_1$ and capacitor $C_1$. The other terminal of resonant circuit 12 is connected to a common power source $+V_{cc}$ (for example, 9 V). Resonant circuit 12 determines the oscillating frequency of the carrier wave.

An output terminal of resonant circuit 12 is connected through $R_6$ to the base of the other transistor, $T_{13}$, forming the other part of the differential pair of transistors forming differential amplifier 13. Also connected to the base of transistor $T_{13}$ is the collector of transistor $T_{11}$ which has its emitter grounded through resistor $R_8$. Resistors $R_6$ and $R_8$ form a level shift circuit for reducing the amount of feedback of differential amplifier 13.

Transistor $T_{13}$ has its collector connected to common power source $+V_{cc}$. On the other hand, transistor $T_{14}$ has its collector connected through resistor $R_5$ to common power source $+V_{cc}$, and also has its base connected through resistor $R_7$ to common power source $+V_{cc}$. Also connected to the base of transistor $T_{14}$ is the collector of transistor $T_{12}$, with the emitter of transistor $T_{12}$ grounded through resistor $R_9$. The respective bases of transistors $T_{11}$ and $T_{12}$ are connected in common to a constant voltage source $E_4$. Transistors $T_{11}$ and $T_{12}$, to which a constant voltage is supplied from constant voltage source $E_4$ (bias power source) serve to prevent an alternating current component (AC component) being shunted to ground. The purpose of this is to avoid any undesirable influence which a high energy AC component may cause on the other circuits through a common grounded portion of the circuit.

A constant current adjusting means 14 consisting of a plurality of NPN-type transistors is connected between differential amplifier 13 and constant current source 15. Constant current adjusting means 14 is composed of transistors $T_7$ through $T_9$ having their emitters commonly connected together and also connected to the collector of transistor $T_{16}$. Transistors $T_7$ and $T_9$ have their collectors also connected together, and further connected to the common emitter connection of transistors $T_{13}$ and $T_{14}$ forming the differential pair of transistors forming differential amplifier 13. Transistor $T_8$ has its collector connected to common power source $+V_{cc}$. The bases of transistors $T_8$ and $T_9$ are connected together and in turn to the emitter of transistor $T_{10}$. The collector of transistor $T_{10}$ is connected to common power source $+V_{cc}$, and the base of transistor $T_{10}$ is connected through resistor $R_{11}$ to a constant voltage source $E_3$. Transistor $T_7$ has its base connected to the base of transistor $T_6$ forming the modulating signal oscillator circuit 8. The base of transistor $T_5$ which together with transistor $T_6$ forms a differential pair, is connected to the bases of transistors $T_9$ and $T_8$ so as to apply a constant bias to the bases of transistors $T_9$ and $T_8$. Constant current adjusting means 14 serves to vary the constant current $I_1$ which is selectively fed to the differential pair of transistors $T_{13}$, $T_{14}$ forming differential amplifier 13, in dependence on the switching of transistors $T_7$, $T_8$ and $T_9$.

The modulating signal synthesized by modulating signal oscillator circuit 8 is produced at the base of transistor $T_6$ and is supplied to the base of transistor $T_7$ of constant current adjusting means 14. A signal modulated by the modulating signal appears at the output terminal 16.

The oscillating loop of carrier wave oscillator circuit 9 is formed by the base of transistor $T_{13}$, the emitter of transistor $T_{13}$, the emitter of transistor $T_{14}$, the collector of transistor $T_{14}$, resistor $R_6$, with the loop being closed by the base of transistor $T_{13}$. Oscillation occurs when the gain of this loop is 1 or more. Oscillation frequency is determined by the time constant of resonant circuit 12 formed by coil $L_1$ and capacitor $C_1$, and is expressed by equation 3 as follows:

$$F_1 = \frac{1}{2\pi \sqrt{L_1 C_1}} \quad (3)$$

wherein $F_1$ is the oscillating frequency of the carrier wave. The oscillating power (i.e., the oscillating amplitude of the carrier wave) is determined by the product of the current I flowing through the differential pair of transistors $T_{13}$, $T_{14}$ forming differential amplifier 13 and the impedance of resonant circuit 12.

Figure 5:
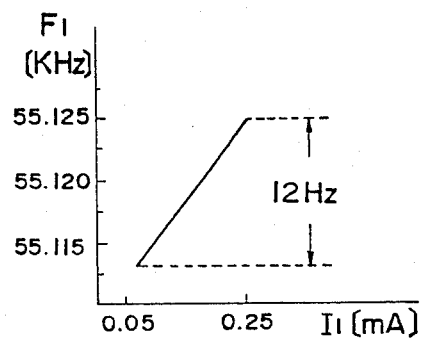
FIG. 5 is a graph showing the frequency characteristic of a carrier wave oscillator circuit of the present invention.

Any change in the oscillating frequency $F_1$ occurring as a result of a change in the current $I_1$ flowing through differential pair of transistors $T_{13}$, $T_{14}$ forming differential amplifier 13 is, for practical purposes, of negligible value as shown in FIG. 5.

Figure 4:
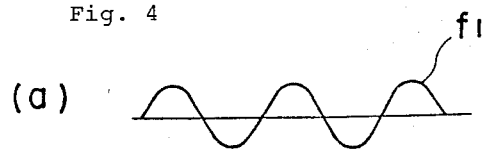
FIG. 4 illustrates the operation of each portion of the circuit shown in FIG. 3.
Figure 4:
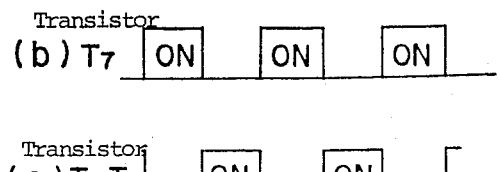
Figure 4:
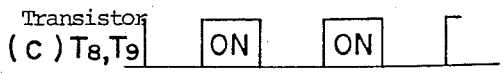
Figure 4:
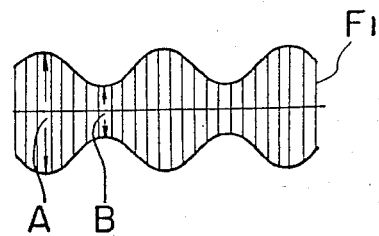

Referring to FIGS. 3 and 4, when a modulating signal $f_1$, having a level sufficient to cause transistors $T_7$, $T_8$ and $T_9$ (forming a differential pair) to undergo a switching action, is supplied to the base of one of transistors $T_7$, $T_8$ or $T_9$ forming a differential pair of transistors forming constant current adjusting means 14, that is, to the base of transistor $T_9$ (see FIG. 4a), transistor $T_7$ is switched on in response to the half cycle of the sine wave above the constant bias of modulating signal $f_1$, while transistors $T_8$ and $T_9$ are switched off. The current $I_1$ flowing through the differential pair of transistors $T_{13}$ and $T_{14}$ of carrier wave oscillator circuit 9 is equal to the current $I_0$ supplied from constant current source 15 (which is the total current flowing through transistors $T_7$, $T_8$ and $T_9$). Conversely, when in response to the half cycle of the sine wave which is below the constant bias of modulating signal $f_1$, transistor $T_7$ is switched off while transistors $T_8$ and $T_9$ are switched on, constant current $I_0$ is divided between transistors $T_8$ and $T_9$, and the current $I_1$ flowing through the differential pair of transistors $T_{13}$ and $T_{14}$ is equal to one-half of the value of current $I_0$. As described above, the carrier wave oscillating level is determined by the product of the impedance of resonant circuit 12 and the current $I_1$ flowing through the differential pair of transistors $T_{13}$ and $T_{14}$, and therefore, the carrier wave of frequency $F_1$ is amplitude-modulated by the modulating signal of frequency $f_1$ as shown in FIG. 4a, as can be seen from FIG. 4d. Since the degree of amplitude-modulation is given by equation 2, the modulation degree m can be expressed as follows:

$$\frac{k\left(I_0 - \frac{I_0}{2}\right)}{k\left(I_0 + \frac{I_0}{2}\right)} \times 100 = \frac{\frac{1}{2}}{\frac{3}{2}} \times 100 = 33.3 \,(\%) \quad (4)$$

It should be noted that k represents a proportional constant. It will be appreciated that the above described relation applies where transistors $T_7$, $T_8$ and $T_9$ have equal operating characteristics.

Thus, since the constant current $I_1$ flowing through the differential pair of transistors $T_{13}$ and $T_{14}$ forming differential amplifier 13 can be adjusted by causing transistors $T_7$, $T_8$ and $T_9$, which are inserted in the circuit for the flow of constant current $I_0$ and operable differentially, to undergo a switching action in response to the modulating signal, the degree of modulation can be maintained at a constant value irrespective of any change occurring in the amplitude of the modulating signal.

The circuit of FIG. 3 described above can be constructed from discrete parts. However, it is preferred to make the circuit of FIG. 3 in the form of an IC, or to incorporate it onto an IC having other circuits. Carrier wave oscillator circuit 9, which concurrently serves as the modulation circuit, does not require any filter circuit consisting of an inductance and, therefore, takes a convenient form for fabrication onto an IC. When fabricated onto an IC, the area enclosed within the broken line in FIG. 3 can comprise the IC 17, with 18, 19 and 20 designating terminal pins of IC 17 located at the edge thereof. Oscillator tank circuit 12 including variable inductance coil $L_1$ and capacitor $C_1$ is connected exteriorly to terminal pin 18, while reed filter 10 of the modulating signal oscillator circuit 8 can be connected externally to terminal pins 19 and 20. It should be noted that reed filter 10 need not be the one peculiar to oscillator circuit 8 and may be replaced with a quartz oscillator or a capacitance-resistance oscillator circuit.

Figure 6:
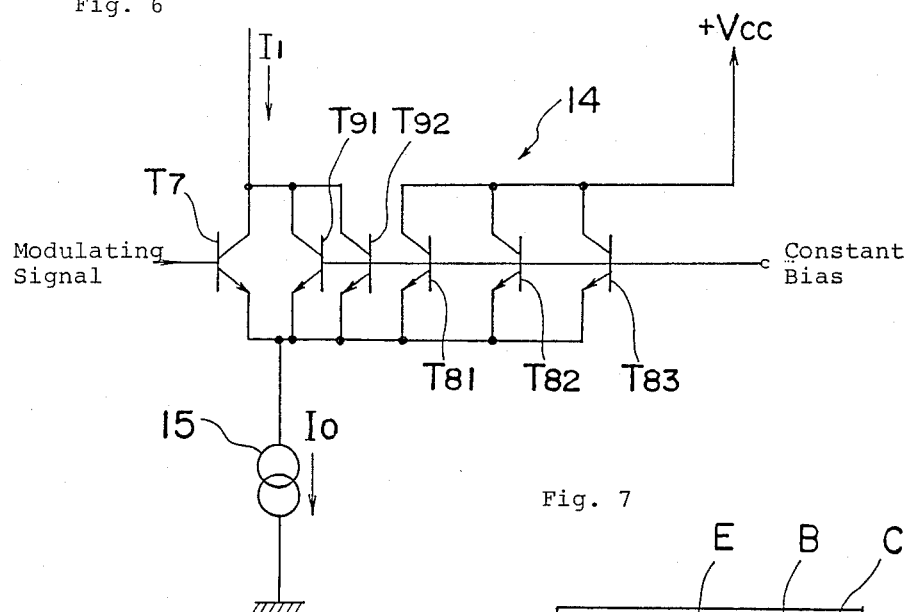
FIG. 6 is a circuit diagram showing another construction of a constant current adjusting means according to the present invention.

FIG. 6 illustrates another example of a constant current adjusting means 14, comprising discrete transistors $T_7$, $T_{91}$, $T_{92}$, $T_{81}$, $T_{82}$, and $T_{83}$ all having uniform operating characteristics. The modulating signal is applied to one transistor, transistor $T_7$, with two transistors, transistors $T_{91}$ and $T_{92}$ having their bases adapted to be supplied with a constant bias and connected with transistor $T_7$ to form differential amplifier 13, while 3 transistors, transistors $T_{81}$, $T_{82}$ and $T_{83}$ are connected to common power source $+V_{cc}$. As will be apparent, these transistors can be functionally classified into three types, and the number of transistors in each of these types may be a plural number.

In the case of the circuit of FIG. 6, the degree of amplitude-modulation is expressed as:

$$\frac{3}{7} \times 100 = 43 \,(\%)$$

Conversely, where the degree of modulation is desired to be 60%, this can be accomplished by eliminating transistor $T_{92}$ from the circuit shown in FIG. 6. For example:

$$m = \left(\frac{1 - \frac{1}{4}}{1 + \frac{1}{4}}\right) \times 100 = \frac{3}{5} \times 100 = 60 \,(\%)$$

Figure 7:
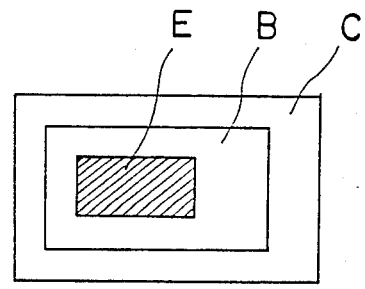
FIG. 7 is a schematic plan view of one transistor fabricated onto an IC.

Thus, when designing the modulation circuit having a degree of modulation which is determined beforehand, it would appear feasible to fabricate the modulation circuit onto an IC. While a schematic plan view of one transistor is shown in FIG. 7, by changing the surface area of one of the collector, base and emitter layers C, B and E, for example, that of the emitter layer E, the current flowing through the transistors of equal characteristic can be controlled. By way of example, when the circuit of FIG. 3 is fabricated onto an IC and it is assumed that the surface area of transistor $T_7$ is S7, and the respective surface areas of transistors $T_8$ and $T_9$ are S8 and S9 and that S7:S8:S9 = 1:3:1, then a modulation circuit having a degree of modulation of 60% can be obtained. In general, when S7:S8:S9 = 1:$n$:$l$, then $m = 100n/(2l+n)(\%)$. Where the degree of modulation is determined beforehand, the IC should be fabricated according to this general equation.

Figure 8:
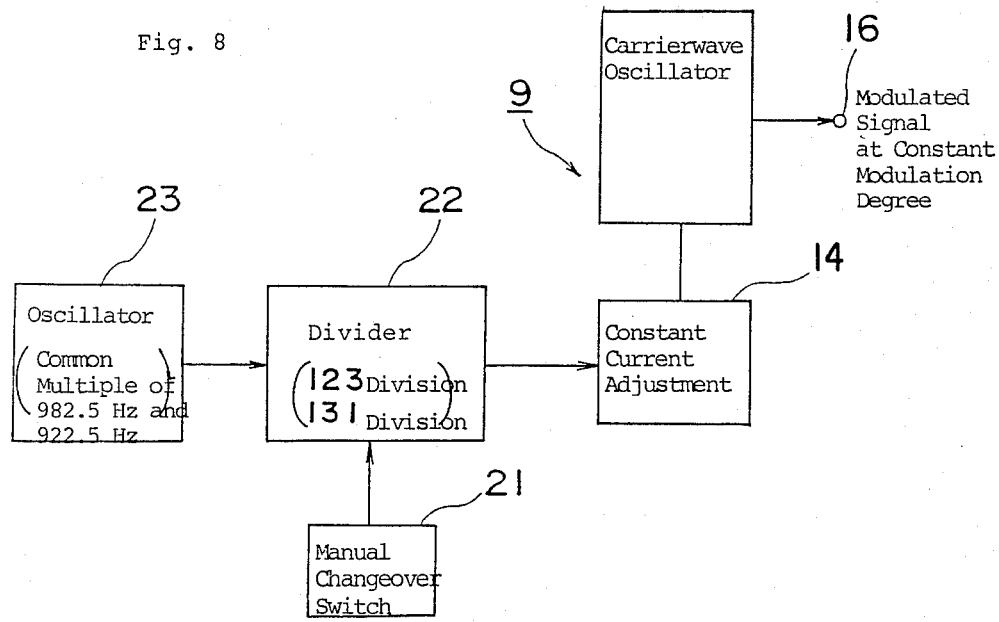
FIG. 8 is a block diagram showing a portion of a device for the changeover of a multiplex sound signal using the AM circuit of the present invention.

FIG. 8 illustrates a portion of a device for switching a multiplex sound signal included in a television signal recorded by, for example, a VTR. In a multiplex sound broadcasting system now employed in Japan, a pilot signal of 982.5 Hz and a pilot signal of 922.5 Hz are employed respectively for stereophonic broadcasting and duplex sound broadcasting. With the use of a carrier wave frequency of 55.125 KHz, these pilot signals are amplitude-modulated at a constant degree of modulation and are then supplied to the antenna terminal of a television receiver.

A manual changeover switch designated at 21 is a manipulatable switch used for selecting between stereophonic, duplex or monophonic sound broadcasting, and feeds the selected signal to a divider circuit 22. Oscillator circuit 23 is employed for oscillating at a common multiple of the frequencies 982.5 Hz and 922.5 Hz of the pilot signals, that is, at 120.8475 KHz. In divider circuit 22, either a division by 123 for stereophonic broadcasting or by 131 for duplex sound broadcasting is carried out depending upon a voltage signal from changeover switch 21, and divider circuit 22 supplies either one of the pilot signals to constant current adjusting means 14 as a modulating signal. As hereinabove described, a signal modulated at a constant degree of modulation is obtained at output terminal 16, and the pilot signal is then detected in the television receiver and discriminated.

Although in the foregoing description a basic embodiment has been explained, the amplitude-modulation circuit of the present invention should not be limited to such embodiment, but may take other forms without departing from the scope of the claims appended hereto.

We claim:

1. An amplitude modulation circuit comprising a resonant circuit for the determination of a carrier wave frequency connected to the collector of one transistor of a differential pair of transistors forming a differential amplifier, said differential amplifier having its ground terminal connected to a constant current source; an output terminal of said resonant circuit being coupled to the base of the other transistor forming the differential pair so as to supply positive feedback to said other transistor thereby forming a carrier wave oscillator; and constant current adjusting means connected between said differential amplifier and said constant current source and also coupled to a modulating signal generating means so as to receive a modulating signal, said constant current adjusting means being operable to set two different current levels to be supplied to said differential pair, said two different current levels being set at respective positive and negative half-wave periods of said modulating signal.

2. An amplitude modulation circuit comprising a resonant circuit for determining a carrier wave frequency connected to the collector of a first transistor of a differential pair of transistors forming a differential amplifier, said differential amplifier having a ground terminal connected to a constant current source; an output terminal of said resonant circuit being coupled to the base of a second transistor forming said differential pair so as to apply positive feedback to said second transistor thereby forming a carrier wave oscillator; and constant current adjusting means connected between said differential amplifier and said constant current source and also coupled to a modulating signal generating means so as to receive a modulating signal therefrom, said constant current adjusting means being operable to set two different current levels to be supplied to said differential pair, said two different current levels being set at respective positive and negative half-wave periods of said modulating signal, said constant current adjusting means comprising a plurality of transistors having their collectors connected together and having their emitters connected together, with their collectors being also connected to said differential pair of transistors forming said differential amplifier, and at least one additional transistor having its emitter connected to said emitters of said plurality of transistors and having its collector connected to a power line, the base of one of said plurality of transistors being adapted to receive said modulating signal.

3. An amplitude modulation circuit as defined in claim 2, wherein said plurality of transistors comprises two transistors forming a pair.

4. An amplitude modulation circuit as defined in claim 3, wherein circuits other than said resonant circuit are incorporated into an integrated circuit.

5. An amplitude modulation circuit as defined in claim 4, wherein said plurality of transistors of said constant current adjusting means comprises two transistors forming a pair, said at least one additional transistor of said constant current adjusting means comprises one transistor; and wherein, in order to achieve a predetermined constant degree of modulation, the respective surface areas of the emitters of said two transistors and said one transistor are selected to be in a predetermined ratio.

* * * * *